United States Patent [19]

Weischedel

[11] 4,356,416
[45] Oct. 26, 1982

[54] VOLTAGE CONTROLLED NON-SATURATING SEMICONDUCTOR SWITCH AND VOLTAGE CONVERTER CIRCUIT EMPLOYING SAME

[75] Inventor: Richard C. Weischedel, Camillus, N.Y.

[73] Assignee: General Electric Company, Schenectady, N.Y.

[21] Appl. No.: 169,737

[22] Filed: Jul. 17, 1980

[51] Int. Cl.³ .................... H03K 17/04; H03K 17/16; H03K 17/56; H02M 7/537

[52] U.S. Cl. .................................. 307/570; 307/270; 307/280; 307/550

[58] Field of Search .............. 307/261, 280, 300, 570, 307/255, 573, 580, 584, 585, 550; 330/251-270; 363/16-30

[56] References Cited

U.S. PATENT DOCUMENTS

| | | | |
|---|---|---|---|
| 2,783,384 | 2/1957 | Bright et al. | 363/16 X |
| 3,534,281 | 10/1970 | Hillhouse | 330/28 |
| 3,676,713 | 7/1972 | Wiedmann | 307/300 |
| 4,054,805 | 10/1977 | Stebbins | 307/571 |
| 4,092,551 | 5/1978 | Howard et al. | 307/270 X |
| 4,100,564 | 7/1978 | Sasayama | 357/46 |
| 4,118,640 | 10/1978 | Ochi et al. | 307/300 X |
| 4,164,747 | 8/1979 | Gerstner | 307/255 X |
| 4,184,197 | 1/1980 | Cuk et al. | 363/16 |
| 4,224,535 | 9/1980 | Wilson et al. | 307/255 X |
| 4,239,989 | 12/1980 | Brajder | 307/255 |

OTHER PUBLICATIONS

Barlage, "A New Switched-Mode Converter Technique Combines VMOS and Bipolar", Solid State Power Conversion, Jul./Aug. 1978, (pp. 8-13).

*Primary Examiner*—Larry N. Anagnos
*Attorney, Agent, or Firm*—Julius J. Zaskalicky; James C. Davis, Jr.; Marvin Snyder

[57] ABSTRACT

A voltage controlled semiconductor power switch including a bipolar transistor efficiently driven by a field effect transistor coupled between collector and base electrodes for providing a non-saturated conduction of the transistor and rapid switching speeds. The switch is employed in voltage converter circuits which require minimum dead time in the application of drive pulses, and have an efficient circuit operation and reduced circuit complexity.

3 Claims, 4 Drawing Figures

VOLTAGE CONTROLLED NON-SATURATING SEMICONDUCTOR SWITCH AND VOLTAGE CONVERTER CIRCUIT EMPLOYING SAME

BACKGROUND OF THE INVENTION

The invention pertains generally to semiconductor power switches and, in particular, to non-saturating switches of this type. The invention further relates to voltage converter circuits that employ semiconductor power switches.

Transistor power switches have as a principal requirement high switching speeds, i.e., rapid transitions between the fully conducting state and nonconducting state. If the transistor is allowed to go into saturation in its conducting state, whether it be a high quality, high frequency device or a relatively inexpensive one, switching speed is greatly reduced. This is due to the storage of excess charge in the base region occurring during saturation, which charge must be swept out before the transistor can be rendered nonconducting. The time required for removing stored charge is defined as the storage time. Furthermore, switching speed varies with load conditions, which is undesirable. A number of techniques have been employed by those skilled in the art for avoiding the limitations of operating these transistors into saturation, but none are found to be entirely satisfactory.

Two prominent techniques are the Baker clamp and the Darlington circuit. The Baker clamp uses two diodes connected to the base drive of the transistor switch, one diode connected in series to the base electrode and the other diode connected to the collector electrode. The second diode prevents saturation by shunting the base drive current through the collector as the transistor approaches saturation. The circuit requires maximum load and minimum transistor current gain (Beta) conditions to be anticipated. While avoiding saturation, the circuit requires excessive drive currents, and is therefore inefficient in its operation.

The Darlington circuit comprises a first stage, low current transistor that drives a second stage power transistor so as to prevent the latter from entering saturation. Although operation of this circuit is relatively efficient since the drive current for the power transistor adjusts to load conditions, switching speed is nevertheless limited by the first stage transistor going into saturation. While not as great a reduction in switching speed as when the power transistor saturates, it is nevertheless a significant limitation in the switch operation.

With respect to dc to ac or dc to dc voltage converter circuits which employ power switches in the form of bipolar transistor pairs operated in push-pull fashion, utilizing the Baker clamp to avoid a saturated operation results in inefficiencies, as above noted. On the other hand, employing transistor power switches allowed to operate into saturation, or when using a Darlington circuit, there is a danger of the transistor pairs overlapping in their conduction. This may occur as a result of the limited switching speeds allowing one transistor to turn on before the other has turned completely off. Overlap can cause the transformer to saturate, resulting in damaging current and voltage spikes and the generation of high frequency noise. The technique commonly employed to avoid overlap is to provide a delay between drive pulses, known as dead time, which must be greater than the maximum transistor turn off time. In addition, series R-C snubber circuits and zener diode transorb devices are commonly provided to help absorb any current and voltage spikes that may be generated. Each of these techniques carry disadvantages, however. Dead time in application of the drive pulses, in accordance with its magnitude reduces efficiency and output power, and also requires larger transformers and additional output filtering capacity. Further, R-C snubbers and like circuits, in addition to representing added circuit complexity, require power and generate noise.

SUMMARY OF THE INVENTION

It is accordingly an object of the invention to provide a novel and improved semiconductor power switch that exhibits high switching speeds and operates with high efficiency.

It is a further object of the invention to provide a novel and improved power switch as above described that includes a bipolar transistor which is prevented from operating in a saturated state.

It is another object of the invention to provide a novel and improved power switch as above described that is of relatively simple and inexpensive circuit design.

It is yet a further object of the invention to provide a novel and improved voltage converter circuit that employs non-saturating semiconductor power switches and operates with both high speed and high efficiency.

It is yet another object of the invention to provide a novel and improved voltage converter circuit that can be driven with minimum dead time.

It is another object of the invention to provide a novel and improved voltage converter circuit that does not require snubbers or other voltage suppressing circuit components.

It is a further object of the invention to provide a novel and improved voltage converter circuit that is overall of relatively simple and inexpensive circuit design.

These and other objects are accomplished in accordance with one aspect of the invention by a voltage controlled semiconductor switch comprising a bipolar power transistor having base, emitter and collector electrodes, with its collector-emitter current path connected between a voltage source and a voltage reference point, and a driver field effect transistor having source, drain and gate electrodes and exhibiting a high input impedance at its gate electrode and a finite on resistance between its drain and source electrodes. The drain-source current path of the field effect transistor is coupled from the collector electrode to the base electrode of the bipolar transistor for conducting its base current. The gate electrode is responsive to low power control pulses for controlling the base current conduction so as to switch on and off the bipolar transistor, whereby said bipolar transistor may be prevented from going into saturation by operation of said field effect transistor so as to enhance the switching speed of said bipolar transistor.

In accordance with a further aspect of the invention the voltage controlled semiconductor switch includes the drain-source current path of a further field effect transistor connected from the base electrode of said bipolar transistor to said voltage reference point, the gate electrode of said further field effect transistor being also responsive to said control pulses for contributing to a rapid switching off of the bipolar transistor.

In accordance with yet a further aspect of the invention, there is provided a voltage converter circuit that comprises a pair of semiconductor switches as above defined with respect to the first recited aspect of the invention. The voltage converter circuit includes a transformer having first and second primary windings and a secondary winding, a dc voltage source, first and second bipolar transistors each having base, emitter and collector electrodes, the collector-emitter current path of the first bipolar transistor being connected in series with the first primary and the dc voltage source for conducting current through said first primary winding, and the collector-emitter current path of the second bipolar transistor being connected in series with the second primary winding and said dc voltage source for conducting current through said second primary winding. Also included are first and second driver field effect transistors each having source, drain and gate electrodes, the drain-source current path of the first field effect transistor being coupled between the collector and base electrodes of the first bipolar transistor for conducting its base current, and the drain-source current path of the second field effect transistor being coupled between the collector and base electrodes of the second bipolar transistor for conducting its base current. Control pulses are applied in opposing phase to the gate electrodes of said first and second field effect transistors, respectively, which pulses operate said field effect transistors for alternately switching on and off said bipolar transistors and thereby generate an ac voltage in said secondary winding, whereby the connection of the drain-source current paths may be employed to prevent said bipolar transistors from going into saturation so as to enhance the switching speed of said bipolar transistors and avoid overlap in their operation.

In accordance with yet another aspect of the invention, the above defined voltage converter circuit may be constructed to connect the drain-source current paths of said first and second field effect transistors to taps on the first and second primary windings, respectively, so as to allow operation of the first and second bipolar transistors closer to their saturation state for additional efficiency of operation.

BRIEF DESCRIPTION OF THE DRAWINGS

While the specification concludes with the claims which particularly point out and distinctly claim that subject matter which is regarded as inventive, it is believed the invention will be more clearly understood when considering the following detailed description taken in connection with the accompanying figures of the drawings, in which:

DESCRIPTION OF THE PREFERRED EMBODIMENTS

Figure 1:
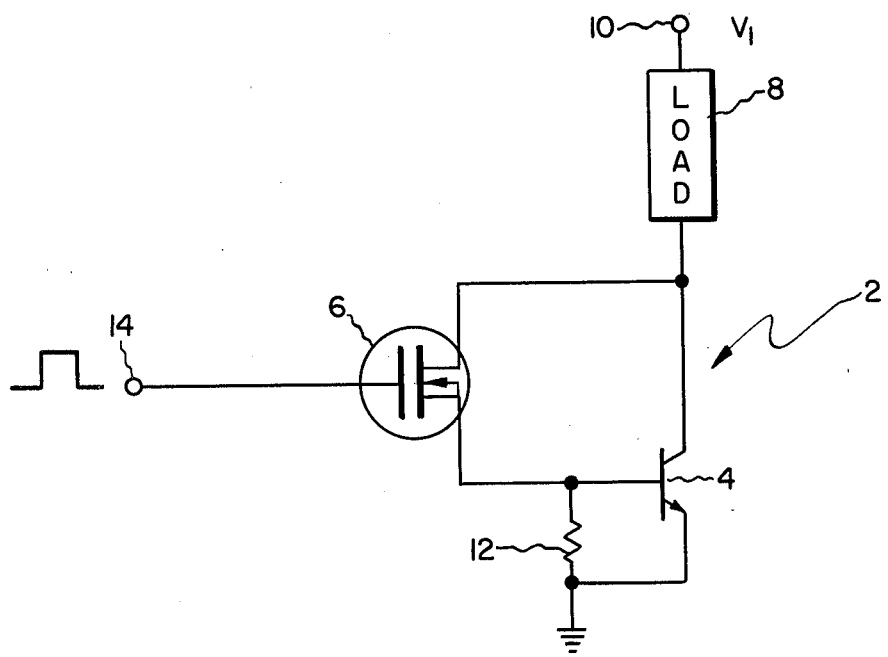
FIG. 1 is a schematic circuit diagram of a voltage controlled semiconductor switch, in accordance with a first embodiment of the invention.

In FIG. 1 is illustrated a voltage controlled semiconductor power switch 2 which, in accordance with a first embodiment of the invention, operates at very high switching speeds and at high efficiency. The switch, which may be energized from a low power source, includes a bipolar power transistor 4 driven by a uniquely coupled field effect transistor (FET) 6 that supplies drive current efficiently obtained from the load current for operating the bipolar transistor entirely in a non-saturated mode.

Bipolar transistor 4 is shown of NPN type having its emitter electrode coupled to ground and its collector electrode coupled through a load 8, which may be resistive or reactive, to a dc terminal 10 to which is applied a dc voltage $V_1$. The base electrode is coupled through a turn off resistor 12 to ground and to the source electrode of field effect transistor 6, the drain electrode of which is coupled to the collector of transistor 4. The gate electrode of the field effect transistor is coupled to an input terminal 14 to which are applied control signal voltage pulses.

The driver field effect transistor 6 is a low power device that is characterized by a very high input impedance, on the order of one or more megohms, and extremely high switching speeds of conduction, on the order of a few nanoseconds. The field effect transistor may be one of several types, typically MOSFET devices.

The bipolar transistor 4 is basically a high power transistor device characterized by high current capabilities and relatively high switching speeds when operated out of saturation, the turn off speed drastically decreasing when the transistor is permitted to conduct into its saturated state. Typically, the device may be one of numerous silicon types. Although shown with NPN conductivity it may also be a PNP transistor, in which event the bias voltages must be appropriately reversed. In addition, an N channel FET is employed with an NPN transistor, and a P channel FET is employed with a PNP transistor. Characteristic of bipolar transistors is a current gain (Beta) that may vary up to several times as a function of temperature. This factor coupled with variable load conditions tend to introduce a saturated conduction, as well as an inefficient operation when the transistor switches are directly driven. While bipolar transistor 4 may exhibit a relatively short turn off time on the order of 50 to 100 nanoseconds for a nonsaturated conduction, in saturation the turn off time may increase one thousand fold. This is due to the storage of excess charge by the internal capacitance across the base-collector junction of the transistor, which charge must be removed before the transistor is rendered nonconducting. In the present invention, connection of the drain-source current path of the field effect transistor 6 prevents the bipolar transistor 4 from going into saturation so as to operate in its high switching speed mode, the FET drive also substantially increasing the efficiency of operation of the switch 2 from that of a conventionally driven bipolar transistor switch.

Control pulses are applied to input terminal 14 with an amplitude that exceeds the gate threshold voltage of the FET 6. The control pulses may be readily generated with rise and fall times that correspond to the switching speed of the FET by low power integrated circuit logic circuitry, such as of MOS or TTL form. Upon occurrence of the rise time of a control pulse and the FET switching on, it initially exhibits a relatively large on resistance between drain and source electrodes and acts as a current source to conduct a relatively large drive current of limited maximum value, $I_D$. This current flows from the load through the drain-source path to the base of transistor 4 for rapidly turning this transistor on. A small current is also supplied to the resistor 12, which resistor is subsequently effective during the turn off phase of the switch operation. Extremely little power is required to drive the FET because of the high input impedance at the gate of the FET. Further, the efficiency of the circuit operation is greatly augmented by virtue of the transistor drive current being derived from the load. Once the transistor 4 conducts and the collector to emitter voltage of the transistor drops toward saturation, the transistor is prevented from entering its saturation state by the flow of transistor drive current through the FET drain-source current path. During this time, the FET acts as a relatively low resistance of limited minimum value, $R_{ON}(min)$, to the flow of drive current. This part of the circuit operation may be better understood by considering the following expression:

$$V_{CE} = V_{BE} + (I_{b1} + I_{b2})R_{ON}$$

where $V_{CE}$ is the collector to emitter voltage of transistor 4 when turned on $V_{BE}$ is the base to emitter voltage of transistor 4

$I_{b1}$ is the base drive current $I_{b2}$ is the current through turn off resistor 12

$R_{ON}$ is the on resistance of FET 6

Accordingly, the voltage drop across the FET reduces the voltage at the base of transistor 4 and prevents the base-collector junction from becoming forward biased so that the transistor 4 can never enter into saturation, irrespective of any changes in the load or Beta.

Upon occurrence of the fall time of the control pulse, the FET switches off almost immediately so that no further drive current flows through it. The turn off time of the transistor 4 is limited by charge stored by the base-collector and base-emitter capacitances of the transistor, which during this transitional period continues to provide base current for keeping the transistor turned on. Turn off resistor 12 serves as a current path for rapidly depleting the stored charge and terminating the base current, thereby switching the transistor off. Since the transistor is not operated in a saturated conduction, stored charge is not excessive and can be rapidly depleted through the current path of resistor 12.

Figure 2:
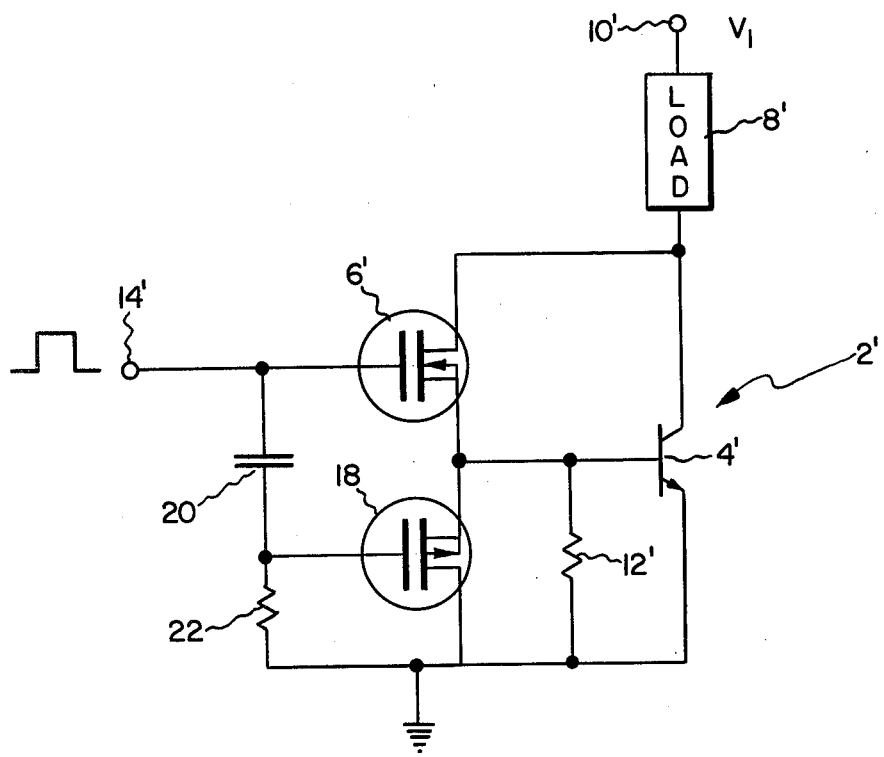
FIG. 2 is a schematic circuit diagram of a voltage controlled semiconductor switch, in accordance with a second embodiment of the invention.

Exemplary circuit components and values for the power switch 2 given for purposes of illustration and in no sense intended to be limiting of the invention, are as follows:

Bipolar transistor 4: NPN Type 2N5038
Field Effect Transistor 6: N Channel MOSFET 2N6661
Resistor 12: 22 ohms
Voltage source $V_1$: 28 volts dc
Control pulses: 0–12 volts peak
Load current: 10 amps
$R_{ON}(min)$: 2 ohms
$I_D$: 2 amps In FIG. 2 is a modified embodiment of the invention in which a second field effect transistor 18 is coupled in the circuit for conducting the turn off current. The power switch of this embodiment is otherwise similar in construction and operation to that of FIG. 1. Corresponding components are identified by the same reference characters as before, but with an added prime notation. FET 18 is of opposite conductivity type to FET 6' and is switched on by a negative voltage. Its source electrode is connected to ground and its drain electrode is connected to the base electrode of transistor 4'. The gate electrode of FET 18 is coupled through a capacitor 20 to input terminal 14' and through a resistor 22 to ground.

In operation, the switch operates during turn on in the same manner as previously described with respect to FIG. 1. During this time, capacitor 20 charges to the peak voltage of the control pulses and the FET 18 is nonconducting. Upon the fall time of the control pulse the FET 6' turns off as before. At this instant a negative voltage is briefly applied to the gate of FET 18 for switching this FET on and providing a low impedance current path for the turn off current. Operation of FET 18 therefore further enhances the rapid switching off speed of power switch 2'.

Figure 3:
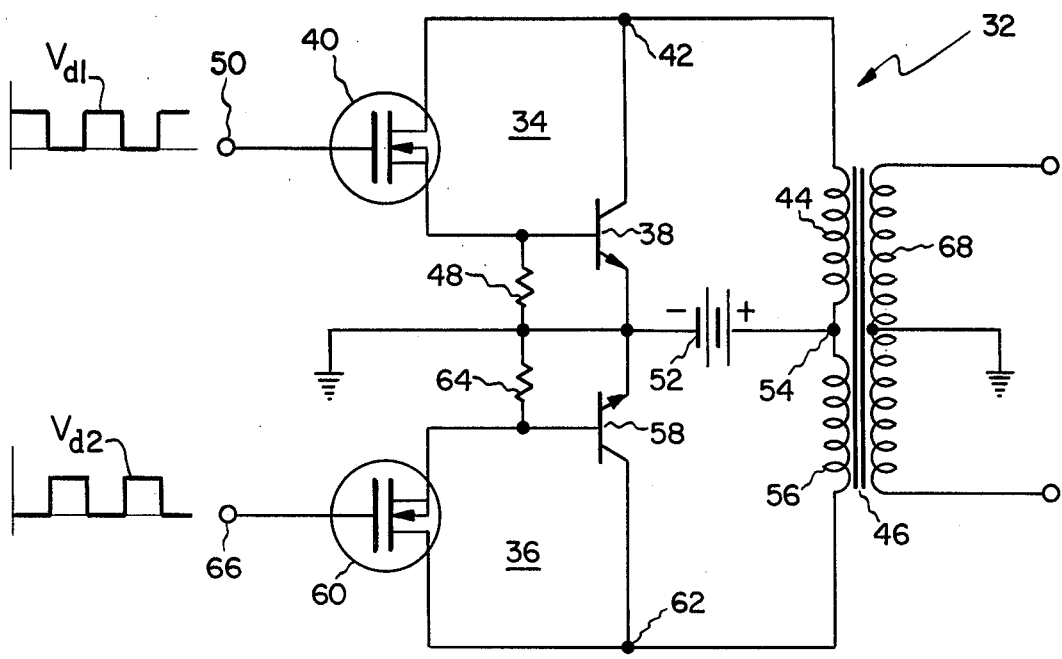
FIG. 3 is a schematic circuit diagram of a voltage converter circuit, in accordance with a third embodiment of the invention.

With reference to FIG. 3 there is illustrated a dc to ac voltage converter circuit 32, which can be readily employed to generate a dc voltage by the addition of a conventional rectifier bridge circuit at the output. The voltage converter circuit includes a pair of semiconductor power switches 34 and 36 of the type shown in FIG. 1 which operate efficiently and at high speed to ensure against overlap in their operating sequences. There is also required a minimum of dead time in the application of the drive pulses for reducing the magnetic requirements of the converter and capacitive filtering requirements at the output.

One portion of converter circuit 32, including power switch 34 comprises NPN bipolar transistor 38 and N channel FET 40, the emitter of transistor 38 being coupled to ground and the collector connected to an end terminal 42 of first primary winding 44 of transformer 46. The base is coupled through turn off resistor 48 to ground and to the source electrode of FET 40. The drain electrode of the FET is connected to terminal 42, and the gate electrode is connected to a first input terminal 50 to which are applied low power drive pulses with a first polarity, shown by the voltage waveform $V_{d1}$. A battery 52 is connected between ground and a terminal 54 which joins winding 44 to a second primary winding 56 of the other portion of the converter. Power switch 36 comprises NPN bipolar transistor 58 and N channel FET 60, the emitter of transistor 58 being coupled to ground and the collector coupled to end terminal 62 of winding 56. The base is coupled through turn off resistor 64 to ground and to the source electrode of FET 60. The drain electrode of FET 60 is connected to terminal 62, and its gate electrode is connected to a second input terminal 66 to which are applied low power drive pulses of opposing polarity to the pulses applied to input terminal 50, shown by the voltage waveform $V_{d2}$. Transformer 46 includes a ground tapped secondary winding 68 from which the output ac voltage is derived. As previously noted, the secondary winding can be connected in conventional fashion to a bridge rectifier circuit not shown, for deriving a dc voltage output.

In operation of the voltage converter circuit of FIG. 3, drive pulses $V_{d1}$ and $V_{d2}$ are applied to input terminals 50 and 66 in opposing phase. Thus, during the application of a pulse of waveform $V_{d1}$, FET 40 rapidly switches on, acting initially as a current source to conduct a relatively large drive current to the base of transistor 38 for turning this transistor on. Once the transistor comes on, the FET acts as a low resistance for supplying sufficient current for maintaining a nonsaturated conduction in the transistor. Transistor 38 is prevented from entering saturation due to the voltage drop across FET 40 which keeps the base-collector junction from becoming forward biased. Load current flows from the positive terminal 54 through primary winding 44 and through the collector-emitter path of transistor 38, with a small fraction of the load current flowing through the drain-source current path of FET 40. Voltage generated across the primary winding 44 is transformer coupled to the secondary winding 68 in well known fashion for comprising one half cycle of the output voltage. During this portion of the operation, there is absence of a pulse of waveform $V_{d2}$ applied to input terminal 66 for keeping FET 60 and transistor 58 turned off, so that current cannot flow in primary winding 56.

Upon termination of the pulse applied to input terminal 50, FET 40 switches off which causes transistor 38 to turn off. Since the circuit is operated with minimum dead time, which is the delay between the fall time of pulse $V_{d1}$ and the rise time of pulse $V_{d2}$, pulse $V_{d2}$ is applied to input terminal 66 closely following pulse $V_{d1}$. FET 60 switches on for conductive drive current to the base of transistor 58 for turning this transistor on. Load current flows from positive terminal 54 through primary winding 56 and the collector-emitter path of transistor 58, with a relatively small amount of load current conducted through FET 60. Voltage generated across primary winding 56 is transformer coupled to the secondary winding 68 for comprising the other half cycle of the output voltage.

In one exemplary circuit operation the drive pulses were applied at a rate of 80 KHz to generate an output frequency of 40 KHz. At this frequency, and for a bipolar transistor turn off time of under 100 nanoseconds, a dead time of only 200-300 nanoseconds is found to be adequate for avoiding overlap in operation of the power switches 34 and 36, which is between 1% and 2½% of the driver pulse width.

Figure 4:
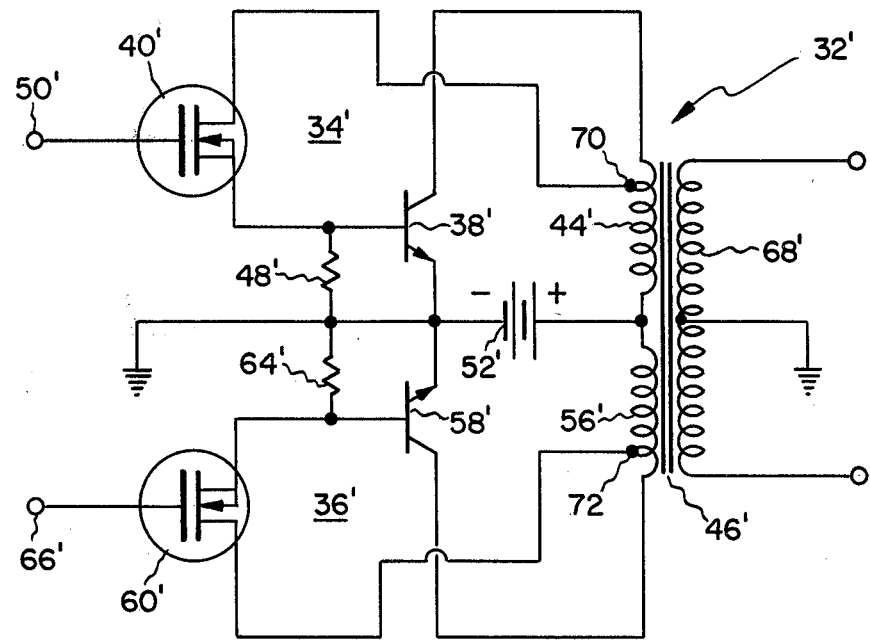
FIG. 4 is a schematic circuit diagram of a modification of the converter circuit of FIG. 3 in accordance with a fourth embodiment of the invention.

In FIG. 4 is a further embodiment of a dc to ac voltage converter circuit similar in construction and operation to that of FIG. 3, except for the drive currents for the bipolar transistors being taken from taps on the primary windings for enhancing circuit efficiency. Corresponding components to those in FIG. 3 are identified by similar reference characters and an added prime notation. Accordingly, the drain-source current path of FET 40' is connected between a tap 70 on winding 44' and the base electrode of transistor 38'. Likewise, the drain-source current path of FET 60' is connected between a tap 72 on winding 56' and the base electrode of transistor 58'. The voltages generated between the taps and their respective end terminals, which are in series with the FET devices, serve to reduce the voltage developed across the collector to emitter electrodes of the bipolar transistors and thereby allow the transistors to more closely approach a saturated conduction than occurs in the operation of the FIG. 3 embodiment. Care must be exercised, however, to have the tapped voltages of a relatively small magnitude in order to avoid having the FETs enter a saturated conduction. This embodiment of the invention is useful where a further improvement in efficiency in the operation of the power switches is desirable. However, the use of somewhat longer dead times may be required than in the previous embodiment to ensure overlap in switch operation.

While the invention has been described with reference to specific embodiments, the following claims are intended to include within their meaning all modifications and alternatives of the circuit that fall within the true scope and spirit of the invention.

What I claim as new and desire to secure as Letters Patent of the United States is:

1. A voltage controlled semiconductor switch comprising:
   (a) a bipolar transistor having base, emitter and collector electrodes,
   (b) first means for coupling the collector-emitter current path of said bipolar transistor between a voltage source and a voltage reference point,
   (c) a driver field effect transistor having source, drain and gate electrodes, and exhibiting a high input impedance at its gate electrode and a finite on resistance between its drain and source electrodes,
   (d) second means for coupling the drain-source current path of said field effect transistor from said collector electrode to said base electrode for conducting the bipolar transistor base current as a portion of the current flowing in said collector-emitter path, said gate electrode being responsive to a control signal for controlling the base current conduction so as to switch on and off said bipolar transistor, whereby said bipolar transistor is prevented from going into saturation by operation of said field effect transistor so as to enhance the switching speed of said bipolar transistor,
   (e) an auxiliary current path coupled from said base electrode to the emitter side of said collector-emitter current path for contributing to a rapid switching off of said bipolar transistor, said auxiliary current path including the drain-source current path of another field effect transistor of opposite conductivity type to that of said driver field effect transistor, the gate electrode of said other field effect transistor being also responsive to said control signal.

2. A voltage controlled semiconductor switch comprising:
   (a) a bipolar transistor of NPN type having base, emitter and collector electrodes,
   (b) first means for coupling said collector electrode to a voltage source and second means for coupling said emitter electrode to a voltage reference point,
   (c) a driver field effect transistor of N channel type having source, drain and gate electrodes, and exhibiting a high input impedance at its gate electrode and a finite on resistance between its drain and source electrodes,
   (d) third means for connecting the drain-source current path of said field effect transistor from said collector electrode to said base electrode for conducting the bipolar transistor base current as a portion of the current flowing from said voltage source to said collector electrode, said gate electrode being responsive to a control signal for controlling the base current conduction so as to switch on and off said bipolar transistor, whereby said bipolar transistor is prevented from going into saturation by operation of said field effect transistor so as to enhance the switching speed of said bipolar transistor, (e) said first means including a load impedance connected between said voltage source and said collector electrode, (f) an auxiliary current path including a resistor means and connected from said base electrode to said voltage reference point for contributing to a rapid switching off of said bipolar transistor, said auxiliary current path also including the drain-source current path of another field effect transistor of P channel type connected in parallel with said resistor means and (g) means for coupling said control signal to the gate electrode of said further field effect transistor.

3. A voltage controlled semiconductor switch comprising:

(a) a bipolar transistor of NPN type having base, emitter and collector electrodes, (b) first means including a tapped load impedance for coupling said collector electrode to a voltage source and second means for coupling said emitter electrode to a voltage reference point, (c) a driver field effect transistor of N channel type having source, drain and gate electrodes, and exhibiting a high input impedance at its gate electrode and a finite on resistance between its drain and source electrodes, and (d) third means including a tapped portion of said load impedance for connecting the drain-source current path of said field effect transistor from said collector electrode to said base electrode for conducting the bipolar transistor base current as a portion of the current flowing from said voltage source to said collector electrode, said tapped portion of said load impedance reducing the voltage across said collector and emitter electrodes during conduction of said bipolar transistor, said gate electrode being responsive to a control signal for controlling the base current conduction so as to switch on and off said bipolar transistor, whereby said bipolar transistor is prevented from going into saturation by operation of said field effect transistor so as to enhance the switching speed of said bipolar transistor.

* * * * *